(12) United States Patent
Sonoda

(10) Patent No.: US 11,018,208 B2
(45) Date of Patent: May 25, 2021

(54) IMAGE PROCESSING DEVICE, DISPLAY DEVICE HAVING THE SAME, AND IMAGE PROCESSING METHOD OF THE SAME

(71) Applicant: Samsung Display Co., Ltd., Yongin-si (KR)

(72) Inventor: Masatoshi Sonoda, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/358,586

(22) Filed: Mar. 19, 2019

(65) Prior Publication Data

US 2019/0305056 A1 Oct. 3, 2019

(30) Foreign Application Priority Data

Mar. 27, 2018 (KR) .................. 10-2018-0034931

(51) Int. Cl.
*H01L 27/32* (2006.01)
*G06K 9/32* (2006.01)

(52) U.S. Cl.
CPC ........ *H01L 27/3244* (2013.01); *G06K 9/3233* (2013.01); *G09G 2320/0233* (2013.01); *G09G 2320/0242* (2013.01)

(58) Field of Classification Search
None
See application file for complete search history.

(56) References Cited

U.S. PATENT DOCUMENTS

| 10,861,420 B2* | 12/2020 | Kondo ............... G09G 5/00 |
| 2005/0104839 A1* | 5/2005 | Baik ............... G09G 3/3406 345/102 |
| 2007/0139433 A1* | 6/2007 | Anderson ............... G06T 15/50 345/582 |
| 2007/0153021 A1* | 7/2007 | Umeda ............... G09G 3/2007 345/600 |
| 2007/0285379 A1* | 12/2007 | Jung ............... G09G 3/342 345/102 |
| 2010/0098349 A1* | 4/2010 | Arashima ............... H04N 5/144 382/263 |
| 2010/0265262 A1* | 10/2010 | Choe ............... G09G 3/342 345/589 |
| 2018/0061307 A1* | 3/2018 | Inoue ............... G09G 3/3275 |

FOREIGN PATENT DOCUMENTS

JP 2002-15327 A 1/2002

* cited by examiner

*Primary Examiner* — Nilufa Rahim
(74) *Attorney, Agent, or Firm* — Lewis Roca Rothgerber Christie LLP

(57) ABSTRACT

An image processing device includes a region divider configured to receive an image data, generate a convert data by converting the image data by pixel rows, and generate a region dividing information that divides the image data into a plurality of regions based on the convert data, a luminance detector configured to detect a region maximum luminance and a region minimum luminance of each of the regions based on the image data and the region dividing information, and a compensator configured to generate compensation image data that compensate a contrast of each of the regions based on the region dividing information, the region maximum luminance, and the region minimum luminance.

20 Claims, 10 Drawing Sheets

FIG. 6
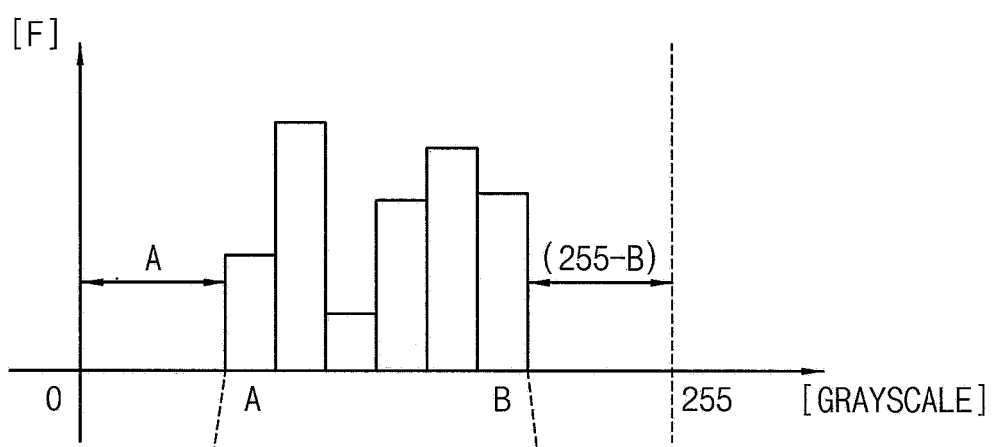
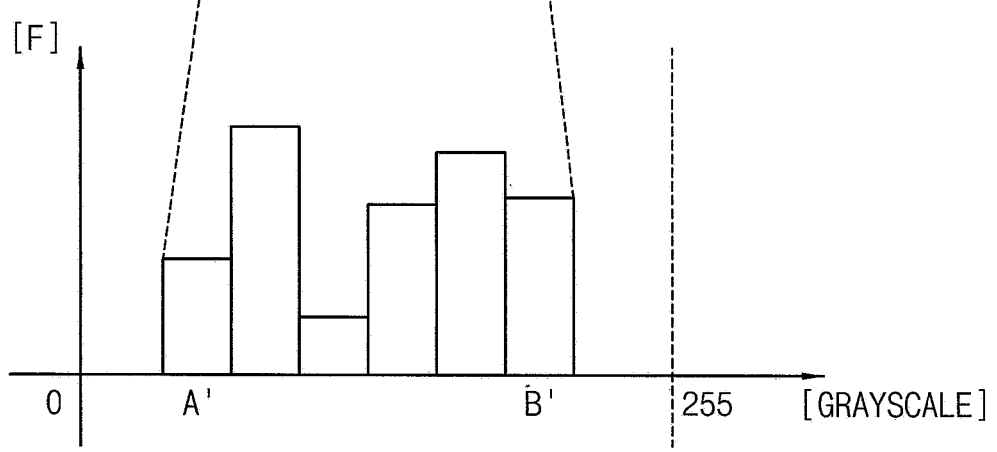

IMAGE PROCESSING DEVICE, DISPLAY DEVICE HAVING THE SAME, AND IMAGE PROCESSING METHOD OF THE SAME

CROSS-REFERENCE TO RELATED APPLICATION

This application claims priority to and the benefit of Korean Patent Application No. 10-2018-0034931, filed on Mar. 27, 2018 in the Korean Intellectual Property Office (KIPO), the entire content of which is incorporated herein in its entirety by reference.

BACKGROUND

1. Field

Example embodiments relate generally to an image processing device, a display device having the same, and an image processing method of the same.

2. Description of the Related Art

Flat panel display (FPD) devices are widely used as display devices of electronic devices because FPD devices are relatively lightweight and thin compared to cathode-ray tube (CRT) display devices. Examples of FPD devices are liquid crystal display (LCD) devices, field emission display (FED) devices, plasma display panel (PDP) devices, and organic light emitting display (OLED) devices. The OLED devices have been spotlighted as next-generation display devices because the OLED devices have various advantages such as a wide viewing angle, a rapid response speed, a thin thickness, a low power consumption, etc.

A method that divides an image into a plurality of regions and respectively compensates the image of the regions is used in order to improve display quality. The image may be divided into the plurality of regions using a method that sets a threshold voltage, a method that extracts an edge of the image, a method that writes a histogram and divides the image according to pixel value, etc. These methods require a memory that stores all image data, a frame memory that stores frame data, a calculator that calculates, etc.

SUMMARY

Aspects of some example embodiments are directed toward an image processing device capable of improving display quality.

Aspects of some example embodiments are directed toward a display device capable of improving display quality.

Aspects of some example embodiments are directed toward an image processing method of the display device.

According to an example embodiment, an image processing device may include a region divider configured to receive an image data, generate a convert data by converting the image data by pixel groups including pixels arranged in a line, and generate a region dividing information that divides the image data into a plurality of regions based on the convert data, a luminance detector configured to detect a region maximum luminance and a region minimum luminance of each of the regions based on the image data and the region dividing information, and a compensator configured to generate compensation image data that compensates a contrast of each of the regions based on the region dividing information, the region maximum luminance, and the region minimum luminance.

In an example embodiment, the compensator may be configured to generate the compensation image data of a current frame based on the region dividing information, the region maximum luminance and the region minimum luminance of the image data provided from a previous frame.

In an example embodiment, the region divider may be configured to generate the convert data by filtering the image data by the pixel groups using a linear filter and determine a boundary of the regions based on the convert data.

In an example embodiment, the linear filter may include a high pass filter and/or a band pass filter.

In an example embodiment, the region divider may output histograms that each represents a distribution of luminance corresponding to the image data by the pixel groups as the convert data and determine the boundary of the regions by comparing the histograms.

In an example embodiment, the region divider may compare the histograms of adjacent pixel groups of the pixel groups. The region divider may determine that the adjacent pixel groups are in the same region when frequency of the image data having the same luminance is greater than or the same as a set or predetermined threshold value. The region divider may determine that the adjacent pixel groups are in different regions when the frequency of the image data having the same luminance is less than the threshold value.

In an example embodiment, the region divider may include a line memory that includes the convert data by the pixel groups.

In an example embodiment, the luminance detector may detect a group maximum luminance and a group minimum luminance of the image data by the pixel groups and detect the region maximum luminance and the region minimum luminance of each of the regions by comparing to the group maximum luminance and the group minimum luminance of the pixel groups in each of the regions.

In an example embodiment, the compensator may extend a range between maximum luminance and minimum luminance in each of the regions.

According to an example embodiment, a display device may include a display panel including a plurality of pixels, an image processor configured to convert an image data corresponding to an image displayed on the display panel to a convert data by pixel groups, divide the image data into a plurality of regions based on the convert data, generate a compensation image data that compensates a contrast of each of the regions based on a region maximum luminance and a region minimum luminance of each of the regions, a data driver configured to generate a data signal based on the compensation image data and provide the data signal to the pixels, a scan driver configured to provide a scan signal to the pixels, and a timing controller configured to generate control signals that control the data driver and the scan driver.

In an example embodiment, the image processor may divide the regions based on the image data provided in a previous frame and generate the compensation image data of a current frame based on a region dividing information that divides the regions.

In an example embodiment, the image processor may generate the convert data by filtering the image data by the pixel groups using a linear filter and determine a boundary of the regions based on the convert data.

In an example embodiment, the image processor may output histograms that each represents a distribution of luminance corresponding to the image data by the pixel groups as the convert data and determine a boundary of the regions by comparing the histograms of adjacent pixel groups of the pixel groups.

In an example embodiment, the image processor may extend a range between maximum luminance and minimum luminance in each of the regions.

According to an example embodiment, an image processing method of a display device may include an operation of generating a convert data by converting an image data by pixel groups and dividing the image data into a plurality of regions based on the convert data, an operation of detecting a region maximum luminance and a region minimum luminance of each of the regions based on the image data, and an operation of generating a compensation image data that compensates a contrast of each of the regions based on the region maximum luminance and the region minimum luminance.

In an example embodiment, the convert data may be generated by filtering the image data by the pixel groups using a linear filter, and the boundary of the regions may be determined based on the convert data.

In an example embodiment, the linear filter may include a high pass filter and/or a band pass filter.

In an example embodiment, histograms that each represents a distribution of luminance corresponding to the image data may be output as the convert data, and a boundary of the regions may be determined by comparing the histograms of adjacent pixel groups of the pixel groups.

In an example embodiment, the operation of dividing the regions may include an operation of comparing the histograms of the adjacent pixel groups, an operation of determining that the adjacent pixel groups are in the same region when a frequency of the image data having the same luminance is greater than or the same as a set threshold value, and an operation of determining that the adjacent pixel groups are in different regions when the frequency of the image data having the same luminance is Jess than the threshold value.

In an example embodiment, the operation of detecting the region maximum luminance and the region minimum luminance may include an operation of initializing the region maximum luminance and the region minimum luminance, an operation of detecting a group maximum luminance and a group minimum luminance of the image data of each of the pixel groups, an operation of comparing the region maximum luminance and the group maximum luminance in each of the regions, and an operation of comparing the region minimum luminance and the group minimum luminance in each of the regions.

Therefore, the image processing device, the display device having the same, and the image processing method of the same may generate the convert data by converting the image data by the pixel groups, divide the image data into a plurality of regions based on the convert data, and improve the contrast of each of the regions based on the region maximum luminance and the region minimum luminance, so that the display quality improves. Further, the image processing device, the display device having the same, and the image processing method of the same may convert the image data by the pixel groups using the line memory, so that a needed capacity of the memory can be decreased.

BRIEF DESCRIPTION OF THE DRAWINGS

Illustrative, non-limiting example embodiments will be more clearly understood from the following detailed description taken in conjunction with the accompanying drawings.

FIGS. 6 and 7 are diagrams illustrating an operation of a compensator included in the image processing device of FIG. 1.

DETAILED DESCRIPTION

Hereinafter, the present inventive concept will be explained in more detail with reference to the accompanying drawings. For conciseness, the term "row" may mean "row," "column," "line," or "group."

Figure 1:
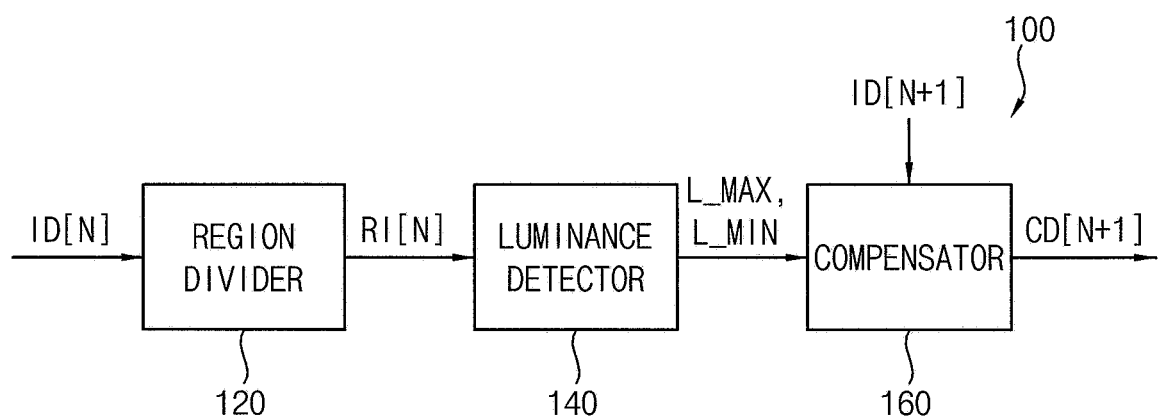
FIG. 1 is a block diagram illustrating an image processing device according to example embodiments.
Figure 2:
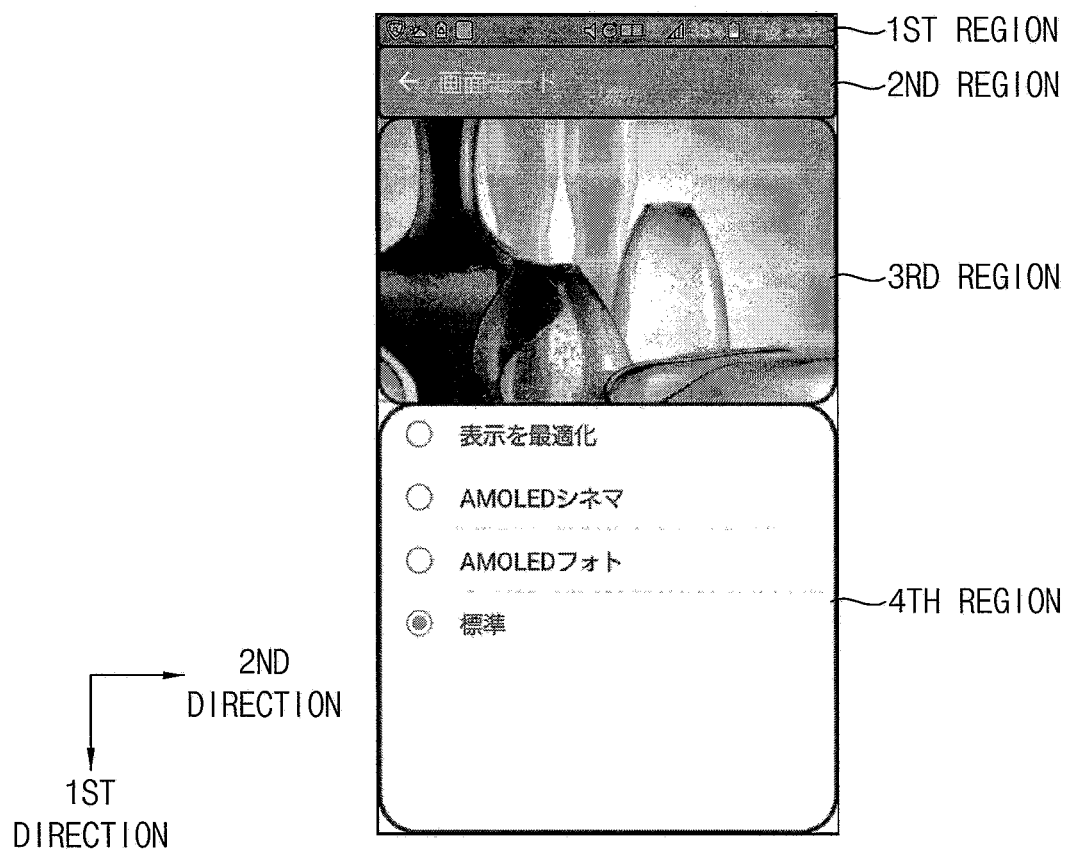
FIG. 2 is a diagram illustrating an operation of a region divider included in the image processing device of FIG. 1.
Figure 3:
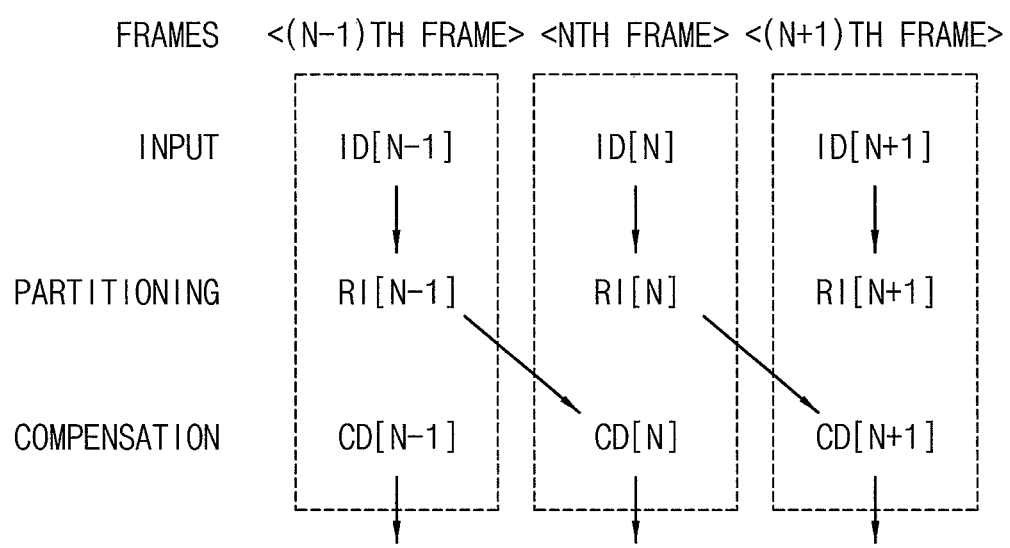
FIG. 3 is a block diagram illustrating an operation of the image processing device of FIG. 1.

FIG. 1 is a block diagram illustrating an image processing device according to example embodiments. FIG. 2 is a diagram illustrating an operation of a region divider included in the image processing device of FIG. 1. FIG. 3 is a block diagram illustrating an operation of the image processing device of FIG. 1.

Referring to FIG. 1, an image processing device 100 may include a region divider 120, a luminance detector 140, and a compensator 160.

The region divider 120 may receive an image data ID[N], generate convert data by converting the image data ID[N] by pixel rows, and generate a region dividing information RI[N] that divides the image data ID[N] into a plurality of regions based on the convert data.

Referring to FIG. 2, an image may be displayed on the display panel of the display device. The display device may display an artificial image that includes characters or figures generated by software and a natural image that includes a captured image or a received image from broadcasting station. The artificial image of FIG. 2 may include a first through fourth regions 1ST REGION through 4TH REGION arranged with each other in a first direction 1ST DIRECTION. The first through fourth regions 1ST REGIONS through 4TH REGION may include different information. An enhanced contrast ratio of each of the first through fourth regions 1ST REGIONS through 4TH REGION may be different from each other because the first through fourth regions 1ST REGIONS through 4TH REGION includes the image having different luminance. The image processing device 100 according to example embodiments may convert the image data ID[N] by pixel rows (i.e., pixel row by pixel row along the first direction 1ST DIRECTION), divide the image displayed on the display panel into a plurality of regions in a second direction 2ND DIRECTION crossing (e.g., perpendicular to) the first direction 1ST DIRECTION based on the convert data, and improve the contrast ratio of each of the regions. Thus, display quality may improve. Hereinafter, the image processing device 100 will be described in more detail.

The region divider 120 may receive the image data ID[N]. The region divider 120 may read the image data ID[N] by the pixel rows and generate a region dividing information RI[N] of each of the regions that divide the image based on the image data ID[N]. In some example embodiments, the region divider 120 may generate convert data by filtering the image data ID[N] by the pixel rows using a linear filter and determine a boundary of the regions based on the convert data. The region divider 120 may output the boundary as the region dividing information RI[N]. The linear filter may detect an edge of the image based on the image data ID[N]. For example, the linear filter may include a high pass filter and/or a band pass filter. Here, the region divider 120 may include a line memory that includes the convert data by the pixel row. The number of the line memory may be determined based on the number of filter coefficient. For example, when the linear filter that uses five filter coefficients is used, the region divider 120 may include the five line memories for five rows. When the linear filter that uses three filter coefficients is used, the region divider 120 may include the three line memories for three rows. In other example embodiments, the region divider 120 may output a histogram that represents a distribution of luminance corresponding to the image data ID[N] by a pixel row as the convert data and determine the boundary of the regions by comparing the histograms of adjacent pixel rows. The region divider 120 may determine that the adjacent pixel rows are in the same region when a frequency of the image data ID[N] having the same luminance is greater than or the same as a set or predetermined threshold value. The region divider 120 may determine that the adjacent pixel rows are in a different region when the frequency of the image data ID[N] having the same luminance is less than the threshold value. The region divider 120 may include a line memory that stores the convert data by the pixel row. Here, the needed capacity of the line memory may decrease by dividing the luminance included in the histogram by the region or store the image data ID[N] having a set or predetermined frequency.

The luminance detector 140 may read the image data ID[N] by the pixel row and detect a region maximum luminance L_MAX and a region minimum luminance L_MIN of each of the regions based on the image data ID[N] and the region dividing information RI[N]. The luminance detector 140 may read the image data ID[N] by the pixel rows and detect a row maximum luminance and a row minimum luminance of each of the rows. The luminance detector 140 may initialize the region maximum luminance L_MAX and the region minimum luminance L_MIN of the first row in one region based on the region dividing information RI[N] provided form the region divider 120. For example, the luminance detector 140 may initialize the region maximum luminance L_MAX and the region minimum luminance L_MIN of the first row in one region as an equation 1.

$$L\_MAX=1.0$$

$$L\_MIN=0.0 \qquad \text{EQUATION 1}$$

Here, the L_MAX is the region maximum luminance L_MAX and the L_MIN is the region minimum luminance L_MIN. The luminance detector 140 may compare the row maximum luminance and the region maximum luminance L_MAX. The row maximum luminance or the region maximum luminance L_MAX that has higher value may be re-determined as the region maximum luminance L_MAX as in equation 2. The row minimum luminance or the region minimum luminance L_MIN that has lower value may be re-determined as the region minimum luminance L_MIN as in equation 2.

$$L\_MAX=\max(L\_MAX, LL\_MAX)$$

$$L\_MIN=\min(L\_MIN, LL\_MIN) \qquad \text{EQUATION 2}$$

Here, the L_MAX is the region maximum luminance, the L_MIN is the region minimum luminance, the LL_MAX is the row maximum luminance, and the LL_MIN is the row minimum luminance.

Specifically, the luminance detector 140 may determine the value of the row maximum luminance as the region maximum luminance L_MAX when the row maximum luminance of the Mth row has a higher value than the region maximum luminance L_MAX, wherein M is greater than or the same as 2. The luminance detector 140 may maintain the value of the region maximum luminance L_MAX as the region maximum luminance L_MAX when the row maximum luminance of the Mth row has a lower value than the region maximum luminance L_MAX. Further, the luminance detector 140 may determine the value of the row minimum luminance as the region minimum luminance L_MIN when the row minimum luminance of the Mth row has a lower value than the region minimum luminance L_MIN. The luminance detector 140 may maintain the value of the region minimum luminance L_MIN as the region minimum luminance L_MIN when the row minimum luminance of the Mth row has a higher value than the region minimum luminance L_MIN. The luminance detector 140 may detect the region maximum luminance L_MAX and the region minimum luminance L_MIN of each of the regions using this method. Although the region divider 120 and the luminance detector 140 of the image processing device 100 are respectively described in FIG. 1, the image processing device 100 is not limited thereto. For example, the region divider 120 and the luminance detector 140 may be integrated, and a generation of the convert data and a detection of the row maximum luminance and the row minimum luminance may be concurrently or simultaneously performed.

The compensator 160 may generate a compensation image data CD[N+1] that compensates a contrast of each of the regions based on the region maximum luminance L_MAX and the region minimum luminance L_MIN. The compensator 160 may generate the compensation image data CD[N+1] of the current frame based on the region dividing information RI[N], the region maximum luminance L_MAX, and the region minimum luminance L_MIN of the image data ID[N] provided from the previous frame. The compensator 160 may extend the luminance range of the image data ID[N] based on the region maximum luminance L_MAX and the region minimum luminance L_MIN of each of the regions. Specifically, when the display device displays an image having a grayscale of 0 through 255 (gray levels) (i.e., the display device may be driven in 8-bit), the grayscale value corresponding to the region minimum luminance L_MIN is A, and the grayscale value corresponding to the region maximum luminance L_MAX is B, a grayscale margin corresponding to the region minimum luminance L_MIN may be A and a grayscale margin corresponding to the region maximum luminance L_MAX may be (255-B). The compensator 160 may change the grayscale value corresponding to the region minimum luminance L_MIN to be between 0 and A. The compensator 160 may change the grayscale value corresponding to the region maximum luminance L_MAX to be between B and 255. The compensator may change the grayscale value of the image data ID[N] provided to the region to have the region maximum luminance L_MAX and the region minimum luminance L_MIN. Thus, the contrast of the image data ID[N] may be extended. For example, the compensator 160 may convert the image data ID[N] of each of the regions using a first function. The compensator 160 may generate the compensation image data CD[N+1] having an enhance (optimize) contrast ratio in each of the regions by changing the contrast of each of the regions based on the region maximum luminance L_MAX and the region minimum luminance L_MIN.

As described above, the image processing device 100 of FIG. 1 may generate convert data by converting the image data ID[N] by the pixel row, dividing the image data ID[N] into the plurality of regions based on the convert data, and improving the contrast of each of the regions based on the region maximum luminance L_MAX and the region maximum luminance L_MIN in each of the regions. Thus, the display quality may improve. Further, the image processing device 100 may convert the image data ID[N] by the pixel rows using the line memory. Thus, the needed capacity of the memory may decrease.

FIG. 3 is a block diagram illustrating an operation of the image processing device of FIG. 1.

Referring to FIG. 3, the image processing device may generate the region dividing information that divides the image data based on the image data of the previous frame and generate the compensation data of the current frame based on the region dividing information. The region dividing information of the previous frame and the region dividing information of the current frame may be substantially the same because an interval of the frames is too short to be recognized by a user (e.g., ⅟60 sec) and the image data between the frames is substantially not changed in the case of an artificial image. Thus, the image processing device may generate the region dividing information that divides the region by analyzing the image data of the previous frame and improving the contrast of each of the regions based on the region dividing information in the current frame.

Specifically, the image processing device may receive the image data ID[N−1] of the (N−1)th frame, generate the convert data by converting the image data of the (N−1)th frame by the pixel row, and generate the image dividing information RI[N−1] that divides the image data into the plurality of regions based on the convert data, where the N is the same as or greater than 2. The image processing device may transfer the region dividing information RI[N−1] generated in the (N−1)th frame. Here, the region maximum luminance and the region minimum luminance of each of the regions detected based on the image data ID[N−1] of the (N−1)th frame may be provided with the region dividing information RI[N−1]. In the Nth frame, the image processing device may generate the compensation data CD[N] that improved the contrast of the image data ID[N] of the Nth frame based on the region dividing information RI[N−1] of the (N−1)th frame.

Figure 4:
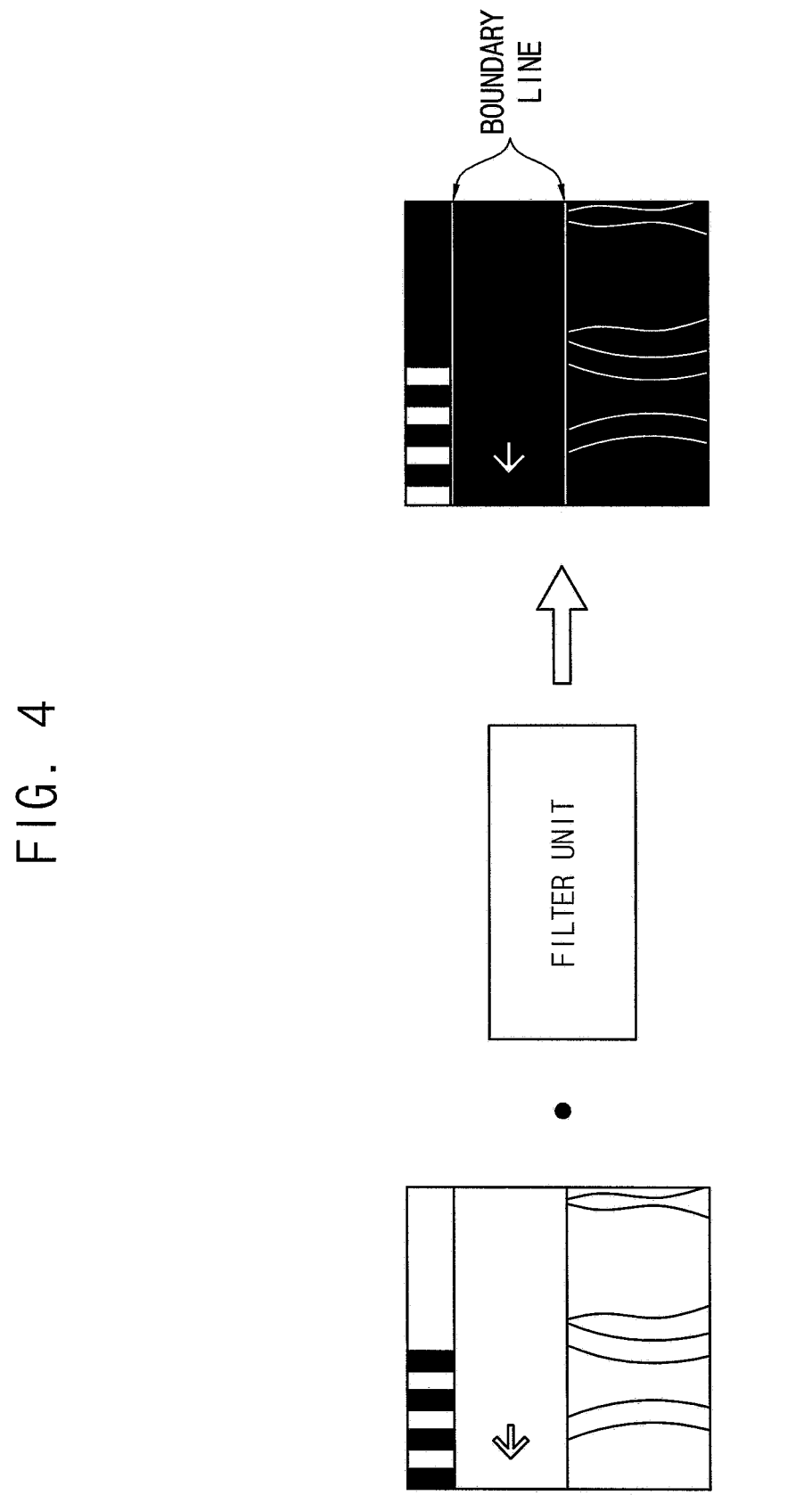
FIG. 4 is a diagram illustrating an example of the region divider included in the image processing device of FIG. 1.

FIG. 4 is a diagram illustrating an example of the region divider included in the image processing device of FIG. 1.

Referring to FIG. 4, the region divider of the image processing device may generate the convert data by filtering the image data by the pixel rows using a linear filter and determine a boundary of the regions based on the convert data. Here, the row number of the line memory may be determined according to the filter coefficient of the linear filter. When the linear filter that uses the five filter coefficients is used, the region divider may include the five line memories for five rows. When the linear filter that uses the seven filter coefficients is used, the region divider may include the seven line memories for seven rows. The region divider may read the image data from the most recent pixel row as the row number of the line memory and input the image data of the next row into the last row of the line memory whenever the process of one row is finished. For example, when the linear filter is a Laplacian filter, the region divider may divide the regions based on an absolute value (hereinafter, a Laplacian absolute value) to which the image data passes the Laplacian filter. When the image data provided to all pixels in the pixel row have the same value or the set or predetermined value, the region divider may determine the pixel row as the boundary of the regions.

Figure 5:
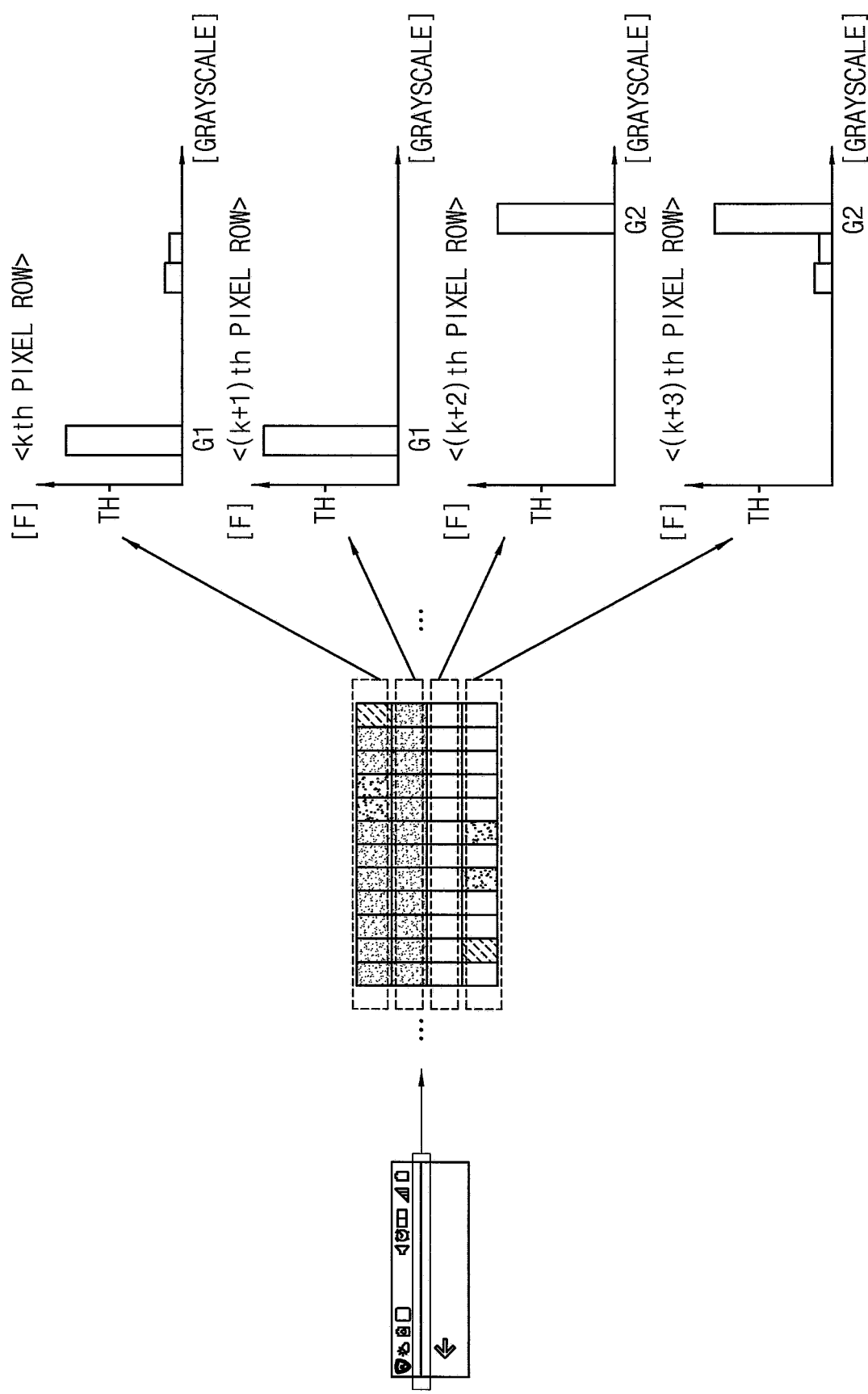
FIG. 5 is a diagram illustrating another example of the region divider included in the image processing device of FIG. 1.

FIG. 5 is a diagram illustrating another example of the region divider included in the image processing device of FIG. 1.

Referring to FIG. 5, the region divider may output the histogram that represents the distribution of the luminance corresponding to the image data by the pixel rows as the convert data and determine the boundary of the regions by comparing the histograms of adjacent pixel rows. The region divider may represent the distribution of the image data (e.g., the grayscale value) of each of the pixel rows as the histogram. When the number of the image data having the same grayscale values is greater than a set or predetermined frequency by comparing the histograms of adjacent pixel rows, the region divider may determine the adjacent pixel rows are in the same region. When the number of the image data having the same grayscale values is less than the set or predetermined frequency by comparing the histograms of adjacent pixel rows, the region divider may determine the adjacent pixel rows are in different regions. Referring to FIG. 5, the region divider may compare the histogram of a Kth pixel row and the histogram of a (K+1)th pixel row and determine the Kth pixel row and the (K+1)th pixel row are in the same region because the frequency of the image data having the same grayscale value G1 is greater than the set or predetermined threshold value, where K is an integer greater than or the same as 1. Further, the region divider may compare the histogram of the (K+1)th pixel row and a (K+2)th pixel row and determine the (K+1)th pixel row and the (K+2)th pixel row are in different regions because the image data having the same grayscale value does not exist. (i.e., the frequency of the image data is less than the threshold). Further, the region divider may compare the histogram of the (K+2)th pixel row and a (K+3)th pixel row and determine the (K+2)th pixel row and the (K+3)th pixel row are in the same region because the frequency of the image data having the same grayscale value G2 is greater than the set or predetermined threshold value. The region divider may store the image data in the line memory by the pixel row. Here, the capacity of the line memory may decrease by dividing the grayscale value included in the histogram by the range or by storing the image data having a frequency greater than the set or predetermined frequency among the image data provided to each of the rows. For example, a capacity of the line memory for 1,440 (width)×3 (RGB)×8 (depth)=34,650 bits is required by the row to process the image data of 1440×2560. When the region divider divides the range of the grayscale value into 10, and stores the histogram using the image data that occupies greater than 2% of the image data provided to each of the row, only the reduced capacity of the line memory for 4,588 bits is required by the row, that is, less than the 0.2 row of the line memory.

Figure 7:
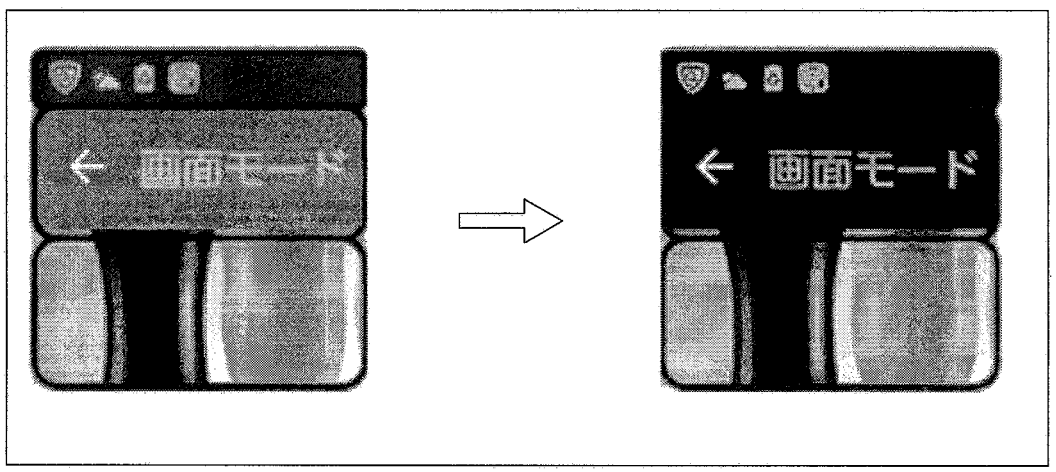

FIGS. 6 and 7 are diagrams illustrating an operation of a compensator included in the image processing device of FIG. 1.

Referring to FIG. 6, the compensator may extend the luminance range based on the region maximum luminance and the region minimum luminance. Referring to FIG. 6, when the display displays the image having the grayscale of the 0 through 255 (gray levels), the grayscale value corresponding to the region minimum luminance is A, and the grayscale value corresponding to the region maximum luminance is B, a grayscale margin corresponding to the region minimum luminance may be A and a grayscale margin corresponding to the region maximum luminance may be (255-B). The compensator may change the grayscale value corresponding to the region minimum luminance to the grayscale value of A' that is greater than 0 and less than A and change the grayscale value corresponding to the region maximum luminance to the grayscale value of B' that is greater than B and less than 255. Further, the compensator may change the grayscale value of the image data between A' and B'. Thus, the contrast of the image data in each of the region may extend. For example, the compensator may convert the image data using a first function as an equation 3.

$$CD = \left(\frac{B' - A'}{B - A}\right) \times ID + \left(\frac{B' - A'}{B - A}\right) \times (A' - A) \qquad \text{EQUATION 3}$$

Here, CD is the compensation data, ID is the image data, A is a grayscale value corresponding to the region minimum luminance, B is a grayscale value corresponding to the region maximum luminance, A' is a grayscale value corresponding to the converted minimum luminance, and B' is a grayscale value corresponding to the converted maximum luminance. Thus, the compensation image data having enhanced contrast ratio to each of the regions may be generated as described in FIG. 7.

Figure 8:
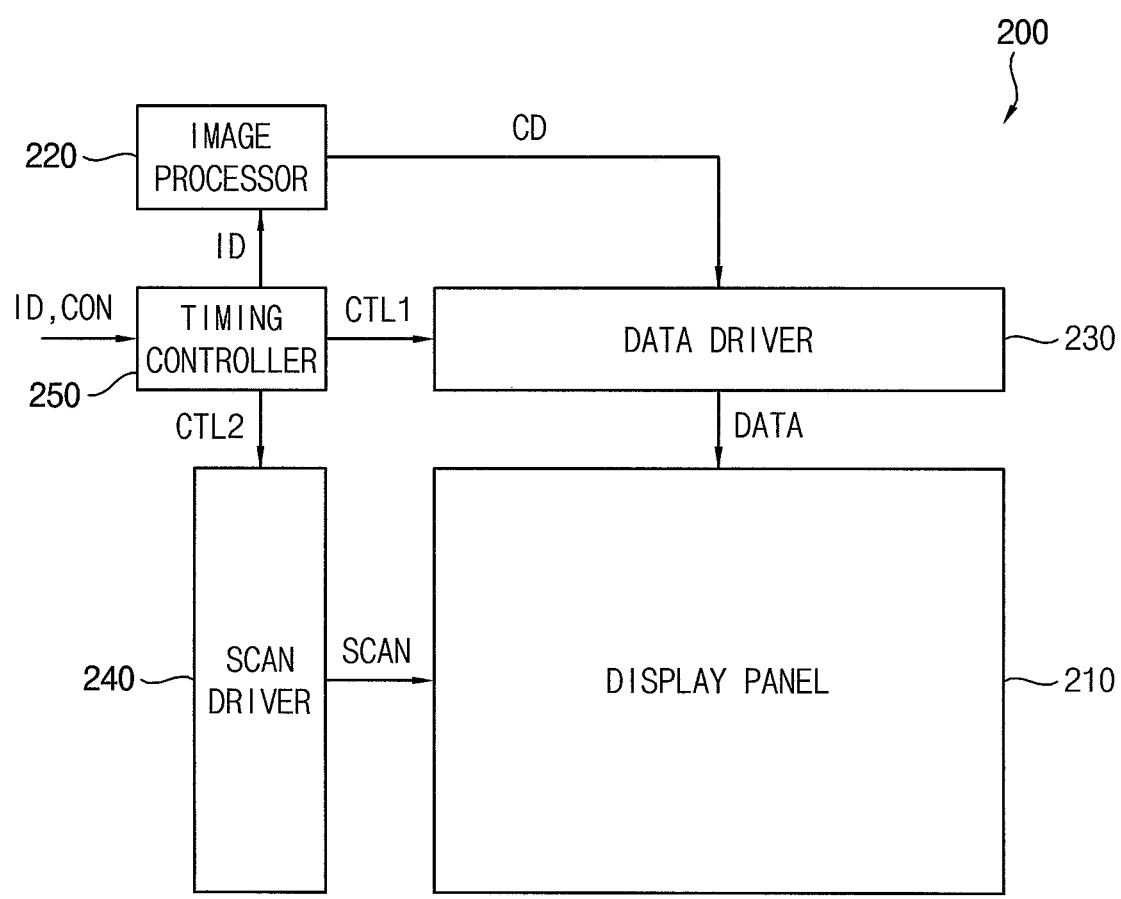
FIG. 8 is a block diagram illustrating a display device according to example embodiments.

FIG. 8 is a block diagram illustrating a display device according to example embodiments.

Referring to FIG. 8, a display device 200 may include a display panel 210, an image processor 220, a data driver 230, a scan driver 240, and a timing controller 250.

The display panel 210 may include a plurality of pixels. A plurality of data lines and a plurality of scan lines may be formed on the display panel 210. The plurality of the pixels may be formed in crossing (intersection) regions of the data line and the scan line. In some example embodiments, each of the pixels may include a pixel circuit, a driving transistor, and an organic light emitting diode. In this case, the pixel circuit may transfer a data signal DATA provided through the data line to the driving transistor in response to a scan signal SCAN provided through the scan line, the driving transistor may control a driving current flowing through the organic light emitting diode based on the data signal DATA, and the organic light emitting diode may emit light based on the driving current.

The image processor 220 may convert the image data ID corresponding to an image that will be displayed on the display panel 210 by pixel rows, divide the image data into a plurality of regions based on the convert data, and generate a compensation image data CD that compensates a contrast of each of the regions based on the region maximum luminance and the region minimum luminance of each of the regions. The image processor 220 may receive the image data ID of a previous frame, generate a region dividing information that divides the region of the image data ID, and generate the compensation image data CD that compensate the contrast of each of the regions by adapting the image dividing information to the image data ID of the current frame. Specifically, the image processor 220 may include an image divider, a luminance detector, and a compensator. The region divider may receive the image data ID, generate the convert data by converting the image data ID by the pixel row, and generate the region dividing information that divides the image data ID into the plurality of regions based on the convert data. In some example embodiments, the region divider may generate the convert data by filtering the image data ID by the pixel row using a linear filter and determine the boundary of the regions based on the convert data. The linear filter may detect an edge of the image based on the image data ID. Here, the region divider may include a line memory that stores the convert data by the pixel row. In other example embodiments, the region divider may output histograms that each represents a distribution of luminance corresponding to the image data by the pixel rows as the convert data, and determine the boundary of the regions by comparing the histograms of adjacent pixel rows. The region divider may determine that the adjacent pixel rows are in the same region when the number of the image data having the same luminance is greater than the threshold value by comparing the histograms of the adjacent pixel rows. The region divider may determine that the adjacent pixel rows are in different regions when the number of the image data having the same luminance is less than the threshold value by comparing the histograms of the adjacent pixel rows. The region divider may include line memory that stores the convert data by the pixel rows. The luminance detector may read the image data ID by the pixel rows and detect a region maximum luminance and a region minimum luminance of each of the regions based on the image data ID. The luminance detector may initialize the region maximum luminance in the first row of the region based on the region dividing information provided from the region divider and detect the region maximum luminance by comparing a row maximum luminance and the region maximum luminance. The luminance detector may initialize the region minimum luminance in the first row of the region based on the region dividing information provided from the region divider and detect the region minimum luminance by comparing a row minimum luminance and the region minimum luminance. The compensator may generate the compensation image data CD that compensates the contrast of each of the regions based on the region maximum luminance and the region minimum luminance. The compensator may extend the luminance range of the image data CD based on the region maximum luminance and the region minimum luminance by the region.

The data driver 230 may generate the data signal DATA based on the compensation image data CD provided from the image processor 220 and provide the data signal DATA to the pixels. The data driver 230 may generate the data signal DATA corresponding to the compensation image data CD in response to a first control signal CTL1 provided from the timing controller 250 and output the data signal DATA to the data line in the display panel 210.

The scan driver 240 may provide the scan signal SCAN to the pixels. The scan driver 240 may generate the scan signal SCAN in response to a second control signal CTL2 and output the scan signal SCAN to the scan line in the display panel 210.

The timing controller 250 may receive the image data ID from an external device. The timing controller 250 may provide the image data ID to the image processor 220. Further, the timing controller 250 may generate the first control signal CTL1 that controls the data driver 230 and the second control signal CTL2 that controls the scan driver 240. The timing controller 250 may output the first control signal CTL1 to the data driver 230 and the second control signal CTL2 to the scan driver 240. Although the image processor 220 coupled to the timing controller 250 is described in FIG. 8, the image processor 220 is not limited thereto. For example, the image processor 220 may be included in the timing controller 250.

As described above, the display device 200 of FIG. 8 may include the image processor 220 that divides the image data ID into the plurality of regions, detects the region maximum luminance and the region minimum luminance of each of the regions, and improves the contrast of each of the regions based on the region maximum luminance and the region minimum luminance. Thus, the display quality may improve. Further, the display device of FIG. 8 may include the image processor 220 that divides the regions by converting the image data ID by the pixel rows using the line memory. Thus, the capacity of the memory may decrease.

Figure 9:
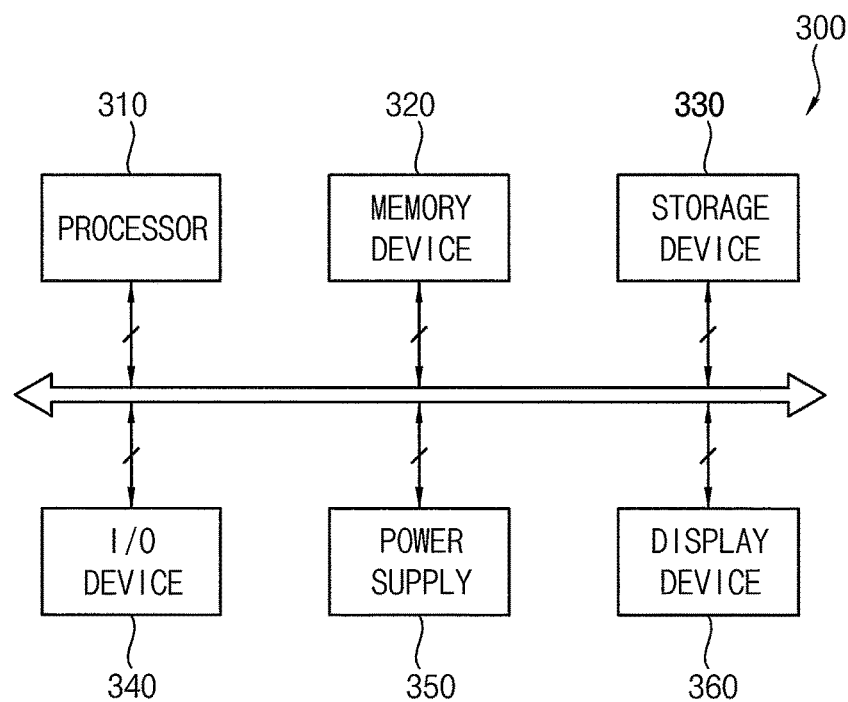
FIG. 9 is a block diagram illustrating an electronic device that includes the display device of FIG. 8.
Figure 10:
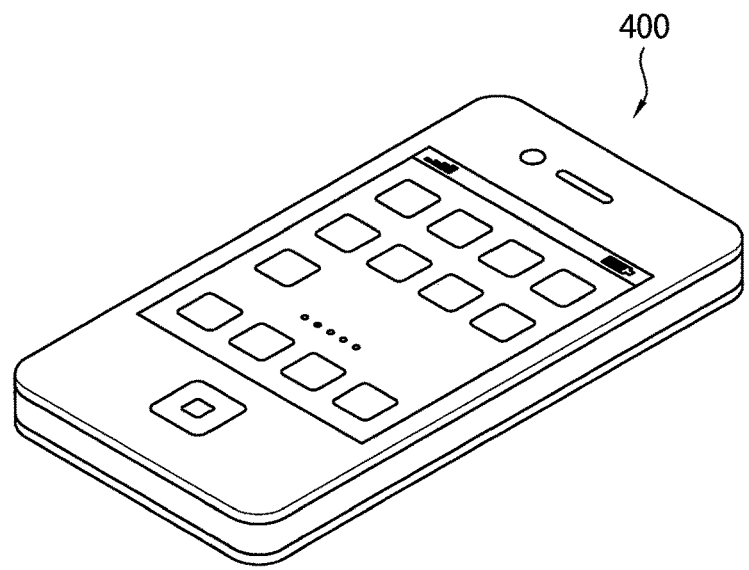
FIG. 10 is a diagram illustrating an example embodiment in which the electronic device of FIG. 9 is implemented as a smart phone.

FIG. 9 is a block diagram illustrating an electronic device that includes the display device of FIG. 8, and FIG. 10 is a diagram illustrating an example embodiment in which the electronic device of FIG. 9 is implemented as a smart phone.

Referring to FIGS. 9 and 10, an electronic device 300 may include a processor 310, a memory device 320, a storage device 330, an input/output (I/O) device 340, a power device 350, and a display device 360. Here, the display device 360 may correspond to the display device 200 of FIG. 8. In addition, the electronic device 300 may further include a plurality of ports for communicating a video card, a sound card, a memory card, a universal serial bus (USB) device, other electronic devices, etc. Although it is illustrated in FIG. 10 that the electronic device 300 is implemented as a smart phone 400, the kind of the electronic device 300 is not limited thereto.

The processor 310 may perform various computing functions. The processor 310 may be a micro processor, a central processing unit (CPU), etc. The processor 310 may be coupled to other components via an address bus, a control bus, a data bus, etc. Further, the processor 310 may be coupled to an extended bus such as peripheral component interconnect (PCI) bus. The memory device 320 may store data for operations of the electronic device 300. For example, the memory device 320 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 330 may be a solid stage drive (SSD) device, a hard disk drive (HDD) device, a CD-ROM device, etc.

The I/O device 340 may be an input device such as a keyboard, a keypad, a touchpad, a touch-screen, a mouse, etc, and an output device such as a printer, a speaker, etc. In some example embodiments, the display device 360 may be included in the I/O device 340. The power device 350 may provide power for operations of the electronic device 300. The display device 360 may communicate with other components via the buses or other communication links.

As described above, the display device 360 may include a display panel, an image processor, a data driver, a scan driver, and a timing controller. The display panel may include a plurality of pixels, a plurality of data lines, and a plurality of scan lines. The plurality of pixels may be formed in crossing (intersection) regions of the data lines and the scan lines. The image processor may convert the image data corresponding to the image displayed on the display panel by the pixel row, divide the image data to the plurality of regions based on the convert data, and generate a compensation image data that compensates a contrast of each of the regions based on a region maximum luminance and a region minimum luminance of each of the regions. The image processor may receive the image data of a previous frame, generate a region dividing information that divides the image data, and generate the compensation image data that compensates the contrast of each of the regions by adapting the image dividing information to the image data of a current frame. In some example embodiments, the image processor may generate the convert data by filtering the image data ID by the pixel rows using a linear filter and determine the boundary of the regions based on the convert data. In other example embodiments, the image processor may output histograms that each represents a distribution of luminance corresponding to the image data by the pixel rows as the convert data, and determine the boundary of the regions by comparing the histograms of adjacent pixel rows. The image processor may read the image data by the pixel rows and detect a region maximum luminance and a region minimum luminance of each of the regions based on the image data. The image processor may detect the region maximum luminance by comparing a row maximum luminance and the region maximum luminance. The image processor may detect the region minimum luminance by comparing a row minimum luminance and the region minimum luminance. The image processor may improve the contrast of each of the regions by extending the luminance range of the image data based on the region maximum luminance and the region minimum luminance. The data driver may generate the data signal based on the compensation image data provided from the image processor and provide the data signal to the pixels. The scan driver may provide the scan signal to the pixels. The timing controller may receive the image data from an external device. The timing controller may provide the image data to the image processor. Further, the timing controller may provide a first control signal to the data driver and a second control signal to the scan driver.

As described above, the electronic device 300 of FIG. 9 may include a display device 360 that divides the image data into the plurality of regions and improve the contrast of each of the regions by detecting the region maximum luminance and the region minimum luminance. Thus, the display quality may improve. Further, display device 360 may divide the regions by converting the image data by the pixel rows using the line memory. Thus, a needed capacity of the memory may decrease.

Figure 11:
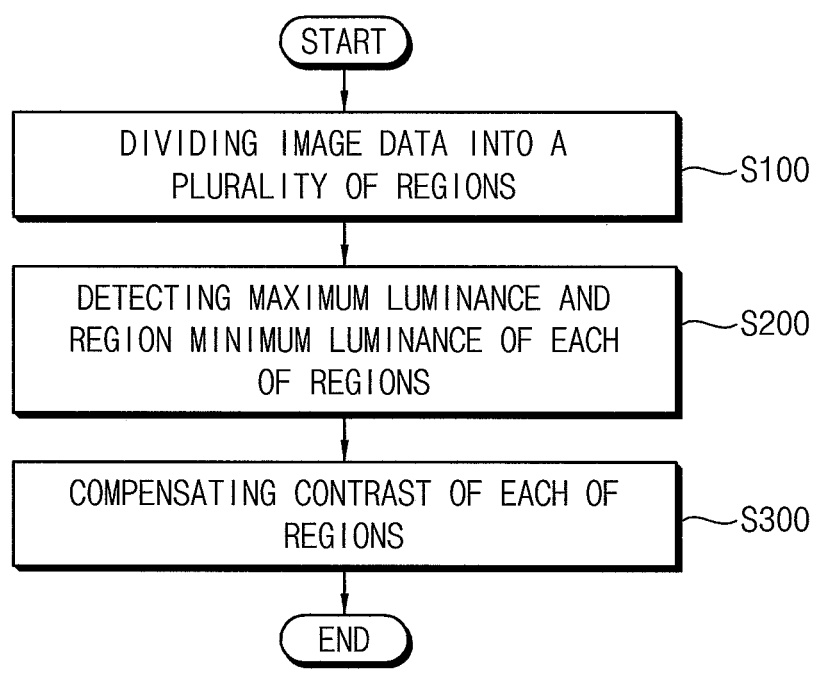
FIG. 11 is a flowchart illustrating an image processing method of a display device according to example embodiments.

FIG. 11 is a flowchart illustrating an image processing method of a display device according to example embodiments.

Referring to FIG. 11, an image processing method of a display device may include an operation of dividing an image data into a plurality of regions S100, an operation of detecting a region maximum luminance and a region minimum luminance of each of the regions S200, and an operation of compensating a contrast of each of the regions S300.

The image processing method of the display device may generate a convert data by converting the image data by pixel rows and divide the image data into a plurality of regions based on the convert data S100. In some example embodiments, the image processing method of the display device may generate the convert data by filtering the image data by the pixel rows using a linear filter. A boundary of the regions may be determined based on the convert data. The linear filter may be selected in a group that includes at least one of a high pass filter and a band pass filter. For example, when a Laplacian filter is used, the image process method of the display device may convert the image data to a Laplacian absolute value and determine the pixel row that includes image data having the same Laplacian absolute value as the boundary. In other example embodiments, the image processing method of the display device may output histograms that each represents a distribution of the luminance corresponding to the image data by the pixel rows as the convert data. Here, the boundary of the regions may be determined by comparing the histograms of adjacent pixel rows. The image processing method of the display device may compare the histograms of the adjacent pixel rows. When frequencies of the image data having the same luminance are greater than a set or predetermined threshold value, the adjacent pixel rows may be, determined in the same region. When the frequencies of the image data having the same luminance are less than the threshold value, the adjacent pixel rows may be determined in the different regions.

The image processing method of the display device may detect the region maximum luminance and the region minimum luminance of each of the regions based on the image data S200. The image processing method of the display device may initialize the region maximum luminance and the region minimum luminance in the first row of the region and detect a row maximum luminance and a row minimum luminance by the pixel row. Further, the image processing method of the display device may detect the region maximum luminance by comparing the region maximum luminance and the row maximum luminance and detect the region minimum luminance by comparing the region minimum luminance and the row minimum luminance.

The image processing method of the display device may generate the compensation image data that compensates the contrast of each of the regions based on the region maximum luminance and the region minimum luminance S300. The image processing method of the display device may extend the luminance range of the image data based on the region maximum luminance and the region minimum luminance in each of the regions. Thus, the contrast of each of the regions may improve.

As described above, the image processing method of the display panel may divide the image data into the regions, detect the region maximum luminance and the region minimum luminance of each of the regions, and extend the range between the maximum luminance and the minimum luminance of the region. Thus, the display quality may improve.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The use of "may" when describing embodiments of the inventive concept refers to "one or more embodiments of the inventive concept."

As used herein, the terms "use," "using," and "used" may be considered synonymous with the terms "utilize," "utilizing," and "utilized," respectively.

The disclosed display device and/or imaging processing device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and equivalents thereof.

What is claimed is:

1. An image processing device comprising:
   a region divider configured to:
      receive an image data,
      generate a convert data by converting the image data by pixel groups, each pixel group including pixels arranged in a line, and
      generate a region dividing information that divides the image data into a plurality of regions based on the convert data of the pixel groups;
   a luminance detector configured to detect a region maximum luminance and a region minimum luminance of each of the regions based on the image data and the region dividing information; and a compensator configured to generate a compensation image data that compensates a contrast of each of the regions based on the region dividing information, the region maximum luminance, and the region minimum luminance.

2. The image processing device of claim 1, wherein the compensator is configured to generate the compensation image data of a current frame based on the region dividing information, the region maximum luminance and the region minimum luminance of the image data provided from a previous frame.

3. The image processing device of claim 1, wherein the region divider is configured to generate the convert data by filtering the image data by the pixel groups using a linear filter and determine a boundary of the regions based on the convert data.

4. The image processing device of claim 3, wherein the linear filter comprises at least one selected from among a high pass filter and a band pass filter.

5. The image processing device of claim 1, wherein the region divider is configured to output histograms that each represents a distribution of luminance corresponding to the image data by the pixel groups as the convert data and determine a boundary of the regions by comparing the histograms.

6. The image processing device of claim 5, wherein the region divider is configured to compare the histograms of adjacent pixel groups of the pixel groups,
wherein the region divider is configured to determine that the adjacent pixel groups are in the same region when a frequency of the image data having the same luminance is greater than or the same as a predetermined threshold value, and
wherein the region divider is configured to determine that the adjacent pixel groups are in different regions when the frequency of the image data having the same luminance is less than the predetermined threshold value.

7. The image processing device of claim 1, wherein the region divider comprises a line memory that includes the convert data by the pixel groups.

8. The image processing device of claim 1, wherein the luminance detector is configured to detect a group maximum luminance and a group minimum luminance of the image data by the pixel groups and detect the region maximum luminance and the region minimum luminance of each of the regions by comparing to the group maximum luminance and the group minimum luminance of the pixel groups in each of the regions.

9. The image processing device of claim 1, wherein the compensator is configured to extend a range between maximum luminance and minimum luminance in each of the regions.

10. A display device comprising:
a display panel comprising a plurality of pixels;
an image processor configured to:
convert an image data corresponding to an image displayed on the display panel to a convert data by pixel groups, each pixel group including pixels arranged in a line,
divide the image data into a plurality of regions based on the convert data of the pixel groups, and
generate a compensation image data that compensates a contrast of each of the regions based on a region maximum luminance and a region minimum luminance of each of the regions;

a data driver configured to generate a data signal based on the compensation image data and provide the data signal to the pixels;
a scan driver configured to provide a scan signal to the pixels; and
a timing controller configured to generate control signals that control the data driver and the scan driver.

11. The display device of claim 10, wherein the image processor is configured to divide the regions based on the image data provided in a previous frame and generate the compensation image data of a current frame based on a region dividing information that divides the regions.

12. The display device of claim 10, wherein the image processor is configured to generate the convert data by filtering the image data by the pixel groups using a linear filter and determine a boundary of the regions based on the convert data.

13. The display device of claim 10, wherein the image processor is configured to output histograms that each represents a distribution of luminance corresponding to the image data by the pixel groups as the convert data and determine a boundary of the regions by comparing histograms of adjacent pixel groups of the pixel groups.

14. The display device of claim 10, wherein the image processor is configured to extend a range between maximum luminance and minimum luminance in each of the regions.

15. An image processing method of a display device comprising:
generating a convert data by converting an image data by pixel groups, each pixel group including pixels arranged in a line, and dividing the image data into a plurality of regions based on the convert data of the pixel groups;
detecting a region maximum luminance and a region minimum luminance of each of the regions based on the image data; and
generating a compensation image data that compensates a contrast of each of the regions based on the region maximum luminance and the region minimum luminance.

16. The image processing method of the display device of claim 15, wherein the convert data is generated by filtering the image data by the pixel groups using a linear filter, and
wherein a boundary of the regions is determined based on the convert data.

17. The image processing method of the display device of claim 16, wherein the linear filter comprises a high pass filter and/or a band pass filter.

18. The image processing method of the display device of claim 15, wherein histograms that each represents a distribution of luminance corresponding to the image data are generated as the convert data, and
wherein a boundary of the regions is determined by comparing the histograms of adjacent pixel groups of the pixel groups.

19. The image processing method of the display device of claim 18, wherein the dividing of the image data into the regions comprises:
comparing the histograms of the adjacent pixel groups;
determining that the adjacent pixel groups are in the same region when a frequency of the image data having the same luminance is greater than or the same as a set threshold value; and
determining that the adjacent pixel groups are in different regions when the frequency of the image data having the same luminance is less than the set threshold value.

20. The image processing method of the display device of claim 15, wherein the detecting of the region maximum luminance and the region minimum luminance comprises:
- initializing the region maximum luminance and the region minimum luminance;
- detecting a group maximum luminance and a group minimum luminance of the image data by the pixel groups;
- comparing the region maximum luminance and the group maximum luminance in each of the regions; and
- comparing the region minimum luminance and the group minimum luminance in each of the regions.

* * * * *